(12) United States Patent
Bonart et al.

(10) Patent No.: US 6,838,335 B2
(45) Date of Patent: Jan. 4, 2005

(54) METHOD FOR FABRICATING A VERTICAL TRANSISTOR, AND SEMICONDUCTOR MEMORY CELL HAVING A TRENCH CAPACITOR AND AN ASSOCIATED VERTICAL SELECTION TRANSISTOR

(75) Inventors: Dietrich Bonart, Bad Abbach (DE); Gerhard Enders, Olching (DE); Peter Voigt, Hallbergmoos (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/626,956

(22) Filed: Jul. 25, 2003

(65) Prior Publication Data

US 2004/0021163 A1 Feb. 5, 2004

(30) Foreign Application Priority Data

Jul. 25, 2002 (DE) .......................................... 102 33 916

(51) Int. Cl.⁷ .......................................... H01L 21/8242
(52) U.S. Cl. ........................ 438/247; 438/248; 257/302
(58) Field of Search ................................ 438/244, 245, 438/247, 248, 270, 387, 388, 390, 391; 257/302, 303, 330

(56) References Cited

U.S. PATENT DOCUMENTS

| 5,365,097 | A | | 11/1994 | Kenney | ...................... 257/302 |
| 6,090,661 | A | * | 7/2000 | Perng et al. | ................. 438/248 |
| 6,093,614 | A | | 7/2000 | Gruening et al. | ........... 438/388 |
| 6,211,006 | B1 | * | 4/2001 | Tsai et al. | ..................... 438/247 |
| 6,373,085 | B1 | * | 4/2002 | Hieda | .......................... 257/302 |
| 6,448,610 | B2 | | 9/2002 | Weis | .......................... 257/330 |
| 2001/0030337 | A1 | | 10/2001 | Weis | .......................... 438/238 |

FOREIGN PATENT DOCUMENTS

| DE | 100 11 889 A1 | 9/2001 |
| DE | 101 36 333 A1 | 3/2003 |

* cited by examiner

*Primary Examiner*—Chandra Chaudhari
(74) *Attorney, Agent, or Firm*—Laurence A. Greenberg; Werner H. Stemer; Gregory L. Mayback (57) ABSTRACT

A semiconductor memory is fabricated with a vertical transistor situated in an upper section of a trench above a trench capacitor. First, an auxiliary insulation layer is applied to the conductive material of an inner electrode or to a connecting material of the trench capacitor. The connecting material is situated on the inner electrode, so that, during an epitaxial deposition, semiconductor material grows only on the uncovered sidewalls in the upper section of the trench. A nitride layer, is deposited conformally and the residual cavity between the inner electrode and the epitaxial semiconductor layer is filled with a doped further conductive material. The nitride layer isolates the epitaxial semiconductor layer from the further conductive material, so that no crystal lattice defects can propagate from there into the epitaxial semiconductor layer. Dopants are outdiffused from the further conductive material into the epitaxial semiconductor layer to form a doping region.

21 Claims, 6 Drawing Sheets

METHOD FOR FABRICATING A VERTICAL TRANSISTOR, AND SEMICONDUCTOR MEMORY CELL HAVING A TRENCH CAPACITOR AND AN ASSOCIATED VERTICAL SELECTION TRANSISTOR

BACKGROUND OF THE INVENTION

Field of the Invention

The invention lies in the field of semiconductor technology and relates to a method for fabricating a vertical transistor in the upper section of a trench.

In order to further reduce the distance between adjacent memory cells, a series of publications propose integrating the selection transistor in the upper section of a trench above the trench capacitor.

Thus, e.g. U.S. Pat. No. 5,365,097 discloses a method for fabricating a transistor in an epitaxial semiconductor layer applied to the uncovered sidewalls in the upper section of a trench. During the deposition, polycrystalline semiconductor material grows simultaneously on the surface of the inner electrode of the trench capacitor. So-called closing joints form in the regions in which the growing epitaxial and the polycrystalline semiconductor material meet one another. However, proceeding from the closing joints, crystal lattice defects can extend far into the epitaxial semiconductor material. As a result, reliable functioning of the transistor formed in the epitaxial semiconductor material is not ensured.

The vertical transistors fabricated by the methods disclosed in Published, Non-Prosecuted German Patent Application DE 100 11 889 A1, corresponding to U.S. Pat. No. 6,448,610 B2, and U.S. Pat. No. 6,093,614 are confronted by similar problems.

SUMMARY OF THE INVENTION

It is accordingly an object of the invention to provide a method for fabricating a vertical transistor, and a semiconductor memory cell having a trench capacitor and an associated vertical selection transistor that overcome the above-mentioned disadvantages of the prior art methods and devices of this general type, which enables a comparatively simple process implementation in conjunction with improved process control.

With the foregoing and other objects in view there is provided, in accordance with the invention, a method for fabricating a vertical transistor. The method includes providing a monocrystalline semiconductor substrate having at least one trench formed therein with a lower section and an upper section. At least the lower section of the trench is lined with a storage dielectric and filled with at least one conductive material. The method further includes forming an auxiliary insulation layer on the conductive material, depositing an epitaxial semiconductor layer on uncovered sidewalls of the upper section of the trench, removing the auxiliary insulation layer, and conformally depositing a nitride layer. The nitride layer being so thin that it only partially impairs a current flow. The trench is filled with a doped further conductive material for producing an electrical connection between the conductive material situated in the lower section and a lower partial section of the epitaxial semiconductor layer. The lower partial section of the epitaxial semiconductor layer is doped by indiffusion of dopants from the further conductive material to form a first doping region. A gate dielectric is formed on uncovered regions of the epitaxial semiconductor layer. A gate electrode is formed on the gate dielectric and a second doping region is formed in an upper partial section of the epitaxial semiconductor layer.

In the context of the invention, an epitaxial deposition is understood to be the monocrystalline growth of a semiconductor layer on a monocrystalline support. By contrast, semiconductor layers grown on polycrystalline supports are not epitaxial layers even if they are deposited at the same time as the formation of epitaxial layers.

The auxiliary insulation layer applied to the conductive material situated in the lower section of the trench prevents growth of semiconductor material on the conductive material during the deposition of the epitaxial semiconductor layer. As a result, the epitaxial semiconductor layer grows exclusively on the uncovered sidewalls in the upper section of the trench. In this case, the sidewalls are formed by the surrounding monocrystalline semiconductor substrate.

Afterward, the auxiliary insulation layer is removed, a thin nitride layer is deposited conformally and the trench is filled with a doped further conductive material. This material simultaneously serves as a dopant source from which dopants indiffuse into a lower partial section of the epitaxial semiconductor layer, where they contribute to forming a first doping region. The first doping region later forms the source or drain region of the vertical transistor.

The nitride layer is made so thin that it restricts a current flow only to an insignificant extent, i.e. the electrical resistance of the nitride layer is significantly lower than that of a bulky nitride layer. The thickness of the nitride layer is preferably less than 1 nm, in particular between 4 and 8 Å. The thin nitride layer isolates the epitaxial semiconductor layer from the further conductive material, which is preferably a polycrystalline semiconductor material, in particular doped polysilicon, and thereby protects the epitaxial semiconductor layer from the formation of crystal lattice defects which otherwise form at the boundary layer between epitaxial and polycrystalline materials.

Finally, a gate dielectric and a gate electrode and also a second doping region in the upper partial section of the epitaxial semiconductor layer are formed in order to complete the vertical transistor.

This method has the advantage that the deposition of the epitaxial semiconductor layer is independent of the growth of further layers, so that the deposition process only need be controlled with regard to the thickness of the epitaxial semiconductor layer. The auxiliary insulation layer introduced can be both fabricated and removed again easily. By way of example, the auxiliary insulation layer may be applied as a so-called trench top oxide (TTO) and be removed again by selective etching, for example.

In a preferred embodiment of the invention, the trench has an insulation collar, which, proceeding from the transition region between the lower and upper sections, extends in the direction of the upper section and, is etched back as far as a plane which lies above the auxiliary insulation layer, thereby uncovering the sidewalls of the trench above the insulation collar for the deposition of the epitaxial semiconductor layer.

The insulation collar limits the outdiffusion of the dopants into the surrounding semiconductor substrate, so that far-reaching doping regions cannot form there. The doping regions that form are essentially limited to the epitaxial semiconductor layer.

Furthermore the storage dielectric preferably serves for limiting the outdiffusion of dopants, the storage dielectric lining at least the lower section of the trench. The storage dielectric may extend as far as the upper edge of the insulation collar, and in this case is preferably disposed between the sidewall of the trench and the insulation collar. Even if the insulation collar is partially removed during the removal of the auxiliary insulation layer, the storage dielectric represents a still sufficient diffusion barrier. On account of this limitation of diffusion, the first doping region extends into the semiconductor substrate to a comparatively small extent. Adjacent semiconductor memory cells can therefore be disposed at a smaller distance from one another without the existence of undesirable electrical connections between the first doping regions of adjacent memory cells.

In order to insulate the gate electrode from the further conductive material, before the gate electrode is formed, an insulation layer is applied to the further conductive material.

Preferably, the conductive material forms the material of the inner electrode of the trench capacitor and a conductive connecting material, which covers the inner electrode and is surrounded by the insulation collar. The connecting material is introduced into the trench after the insulation collar has been fabricated.

Preferably, the material of the inner electrode of the trench capacitor, the conductive connecting material and the further conductive material are doped polysilicon.

The invention furthermore relates to a semiconductor memory cell having a trench capacitor and an associated vertical transistor. Semiconductor memory cells of this type are known from the documents already mentioned above, U.S. Pat. No. 5,365,097, Non-Prosecuted German Patent Application DE 100 11 889 A1, and U.S. Pat. No. 6,093,614.

Against the background of these known semiconductor memory cells, the object is to specify a simple and reliable semiconductor memory cell having a vertical transistor which is formed in an epitaxial semiconductor layer and whose active regions are largely free of crystal lattice defects and exhibit a low degree of outdiffusion into the surrounding semiconductor substrate.

The semiconductor memory cell according to the invention has a trench capacitor and an associated vertical transistor that are formed in a monocrystalline semiconductor substrate. The trench capacitor being disposed in a lower and the vertical transistor in an upper section of a trench. The sidewalls of the lower section being lined with a storage dielectric. The inner electrode of the trench capacitor is formed by a conductive material. An insulation collar is disposed in the transition region between lower and upper sections of the trench, which insulation collar covers the storage dielectric. The vertical transistor is formed completely in an epitaxial semiconductor layer disposed on the sidewall of the upper section of the trench. A first doping region of the transistor is formed in a lower partial section of the epitaxial semiconductor layer and a second doping region of the transistor being formed in an upper partial section. The inner electrode of the trench capacitor is electrically conductively connected to the first doping region of the vertical transistor via a further conductive material. A thin nitride layer is situated at least between the further conductive material and the epitaxial semiconductor layer, which nitride layer is so thin that it only partially impairs a current flow. The lower edge of the epitaxial semiconductor layer extends at least as far as the upper edge of the storage dielectric.

The thin nitride layer lying between the further conductive material and the epitaxial semiconductor layer prevents propagation of crystal lattice defects proceeding from the further conductive material into the epitaxial semiconductor layer. As a result, the vertical transistor remains largely free of crystal lattice defects. The nitride layer is so thin that it restricts a current flow only to an insignificant extent, i.e. the electrical resistance of the nitride layer is significantly lower than the resistance of a bulky nitride layer. Although a current flow is reduced by the thin nitride layer, it is still high enough to ensure a sufficient electrical connection between the inner electrode of the trench capacitor and the vertical transistor. The thickness of the nitride layer is preferably less than 1 nm, in particular between 4 and 8 Å.

The storage dielectric, in particular, serves for limiting the outdiffusion of dopants from the further conductive material into the surrounding semiconductor substrate, the storage dielectric extending as far as the lower edge of the epitaxial semiconductor layer. In a further refinement of the semiconductor memory cell according to the invention, the insulation collar furthermore also serves for limiting the outdiffusion of dopants. In this case, the insulation collar encloses at least one conductive connecting material that covers the inner electrode of the trench capacitor. The insulation collar preferably likewise extends at least as far as the lower edge of the epitaxial semiconductor layer. In a further preferred refinement, the epitaxial semiconductor layer extends beyond the upper edge of the insulation collar or of the storage dielectric in the direction of the lower section of the trench, for example by 30 nm.

Preferably, the conductive material of the inner electrode, the connecting material and the further conductive material are doped polysilicon.

Other features which are considered as characteristic for the invention are set forth in the appended claims.

Although the invention is illustrated and described herein as embodied in a method for fabricating a vertical transistor, and a semiconductor memory cell having a trench capacitor and an associated vertical selection transistor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
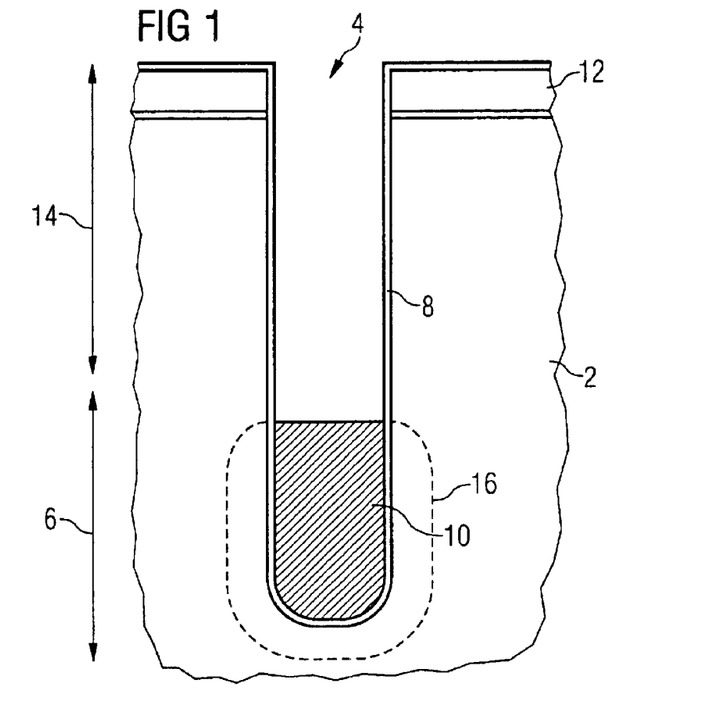
FIGS. 1 to 7 are diagrammatic, sectional views showing individual method steps of a fabrication method according to the invention.

Referring now to the figures of the drawing in detail and first, particularly, to FIG. 1 thereof, there is shown a semiconductor substrate 2 in which a deep trench 4 is disposed, in which a trench capacitor and a vertical transistor are to be formed. The trench 4 is produced by a so-called deep trench etching, for example, during which a nitride mask 12 is used. Afterward, sidewalls of a lower section 6 of the trench 4 are doped, a storage dielectric 8 is formed and the trench 4, in order to form the inner electrode of the trench capacitor, is filled with $n^+$-doped polysilicon 10 and etched back about as far as an upper edge of the lower section 6. The doping of the lower section of the trench forms an outer electrode 16 of the trench capacitor, which is also referred to as a buried plate. The upper section 14 of the trench 4 extends above the lower section 6. The storage dielectric 8 is composed for example of a layer combination containing a nitride layer and an oxide layer. The structure thus obtained is shown in FIG. 1.

Figure 2:
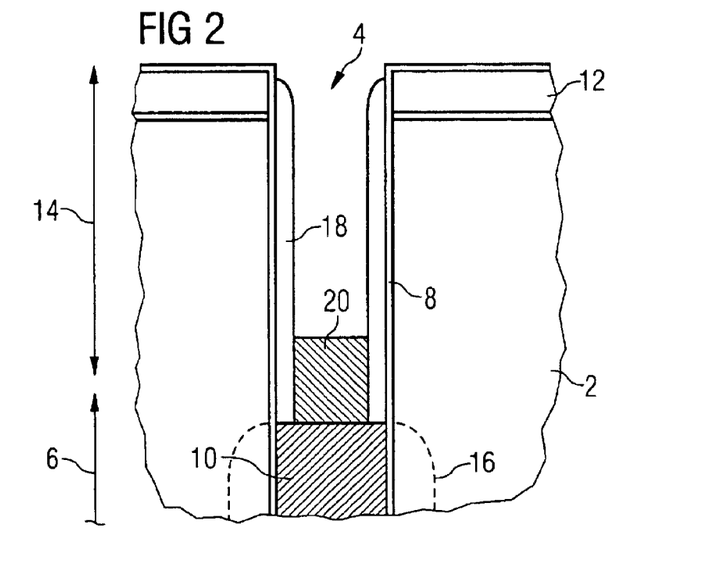

FIG. 2 shows further method steps in which first a CVD oxide is deposited and etched back anisotropically. This produces an insulation collar 18. The latter initially still completely covers the sidewalls of the trench 4 in the upper section. An $n^+$-doped polysilicon is then deposited by a CVD process with subsequent etching-back in order to form the conductive connecting material 20. As an alternative, the conductive connecting material 20 may also be composed of metal.

Figure 3:
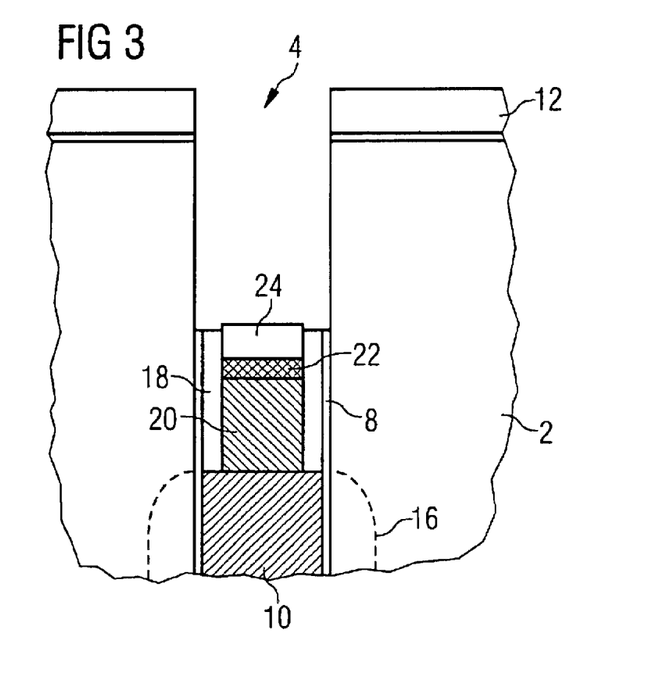

In accordance with FIG. 3, an oxide layer (TTO) 22 is formed on the top side of the connecting material 20. The deposition process used in this case is controlled such that the oxide is essentially deposited only on vertical areas. Afterward, a resist mask 24 serving as an auxiliary layer is formed by filling the trench 4 and etching back the resist material. By use of the auxiliary layer, the auxiliary insulation layer 22 is protected from removal during the subsequent etching of the insulation collar. By an isotropic etching, the upper edge of the insulation collar 18 is subsequently drawn back as far as the level of the lower edge of the vertical transistor that is subsequently to be formed. The storage dielectric 8 is removed at the same time during this or in a subsequent etching step. During the etching-back of the insulation collar 18, oxide that is possibly still situated on the nitride mask 12 and originates from the deposition of the oxide layer 22 is removed at the same time.

Figure 4:
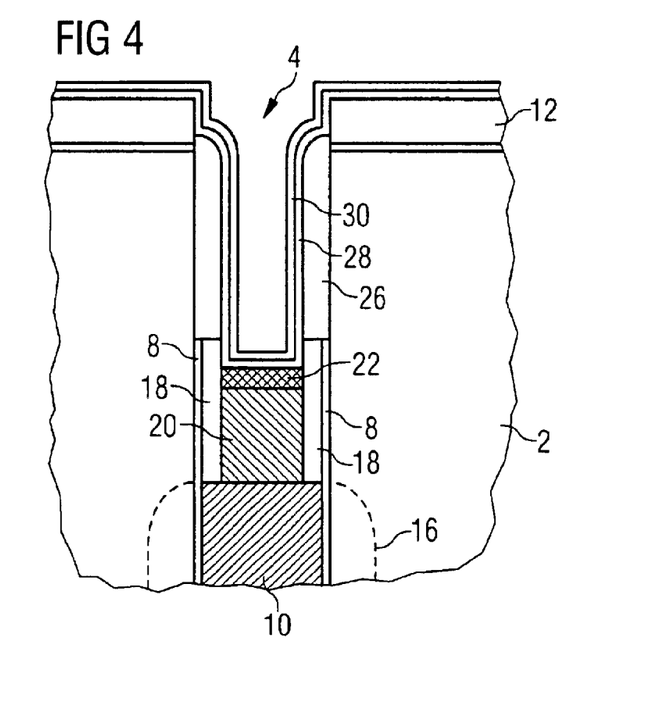

The removal of the resist mask 24 is followed by the deposition of the epitaxial semiconductor layer 26. Since only the sidewalls of the trench 4 in the upper section 14 are uncovered, whereas the conductive connecting material is covered by the oxide layer 22, the deposition leads only to the formation of the epitaxial semiconductor layer 26. The epitaxial semiconductor layer 26 may grow for example up to the thickness of the insulation collar 18 or even beyond that. What is essential is that enough space remains for introducing a gate dielectric and a gate electrode. Auxiliary layers 28 and 30 are then applied conformally, the auxiliary layer 28 being composed of an oxide, for example, and the auxiliary layer 30 being composed of nitride, for example. The structure thus obtained is shown in FIG. 4.

Figure 5:
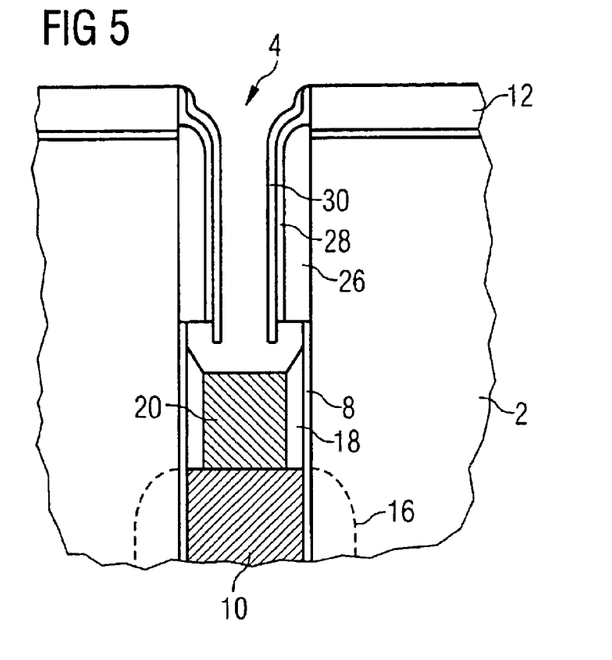

By anisotropic etching, in accordance with FIG. 5, the auxiliary layers 28 and 30 are perforated and the oxide layer 22 is removed centrally. Residual oxide of the oxide layer 22 is subsequently removed by isotropic etching selectively with respect to. the nitride of the auxiliary layer 30. Parts of the insulation collar 18 below the epitaxial semiconductor layer 26 may also be removed in the process.

Figure 6:
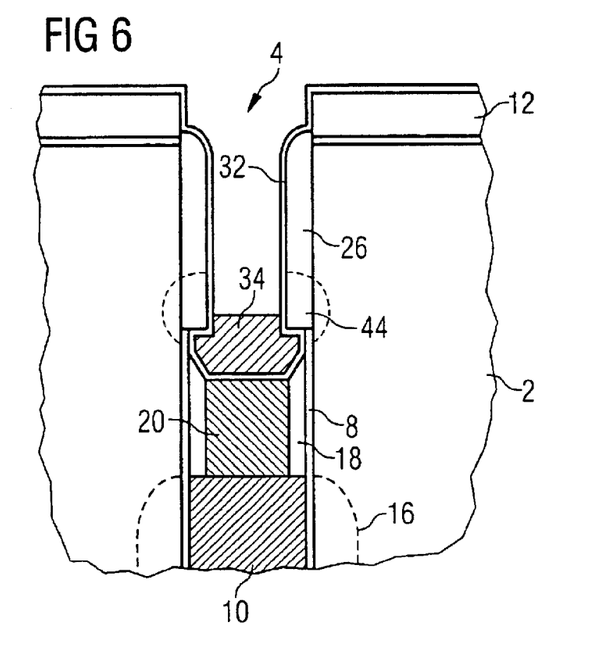

After the removal of the auxiliary layers 28 and 30, a thin nitride layer 32 is produced. Its thickness is less than 1 nm and preferably lies between 4 and 8 Å. Afterward, $n^+$-doped polysilicon is deposited and etched back, the polysilicon representing the doped further conductive material 34. The upper edge of the etched-back further conductive material 34 lies somewhat above the lower edge of the epitaxial semiconductor layer 26. The etching-back of the further conductive material 34 is followed by an implantation of the epitaxial semiconductor layer 26 for the purpose of doping the channel of the vertical transistor. Through a thermal treatment, dopants diffuse out of the further conductive material 34 into the epitaxial semiconductor layer 26 and partly also into the semiconductor substrate 2, where they form a first doping region 44. However, the outdiffusion into the semiconductor substrate 2 is limited by the storage dielectric 8 and the insulation collar 18.

Figure 7:
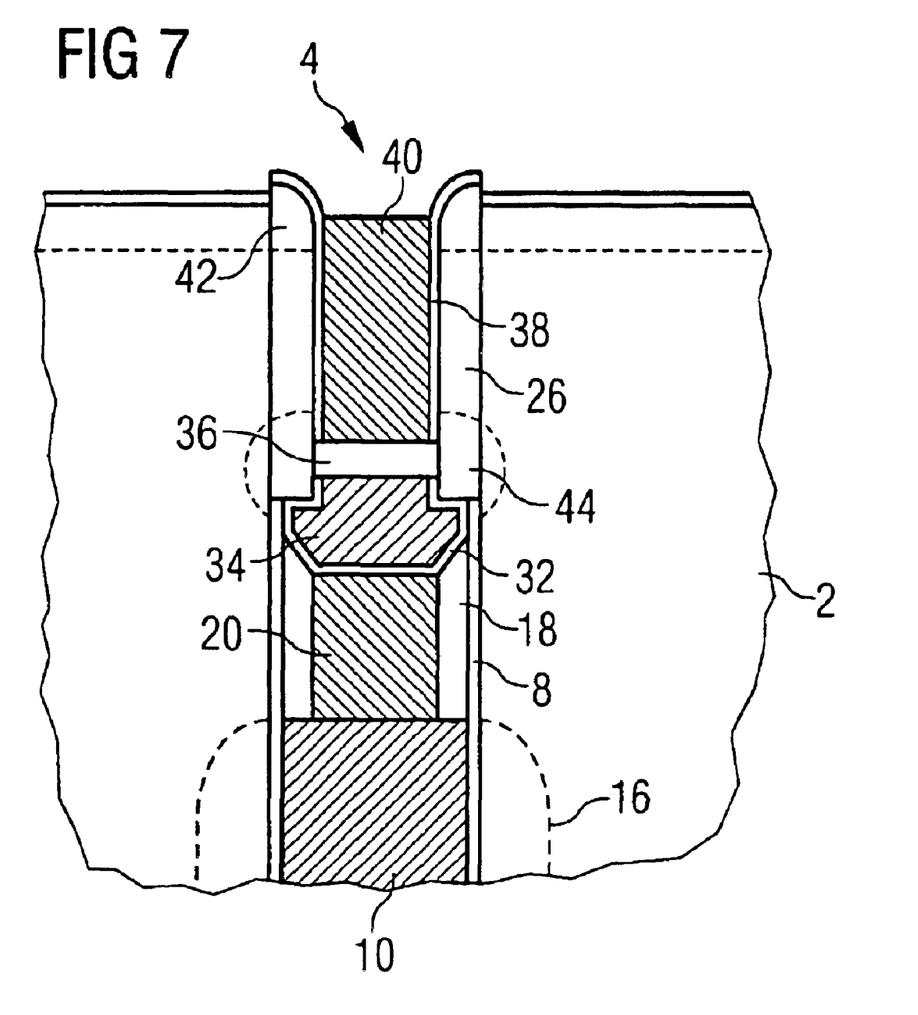

After the removal of the uncovered regions of the thin nitride layer 32, an insulation layer 36 is deposited. The insulation layer, composed of oxide, for example, may be fabricated in a comparable manner to the auxiliary insulation layer 22. A gate dielectric 38 is then grown and a gate electrode 40 is formed by deposition of $n^+$-doped polysilicon. The removal of the nitride mask 12 is followed by an implantation of $n^+$-type regions in the upper partial section of the epitaxial semiconductor layer 26 and of the semiconductor substrate 2 resulting in the formation of $n^+$-type regions 42 representing second doping region.

The vertical transistor is thus completed.

Figure 8:
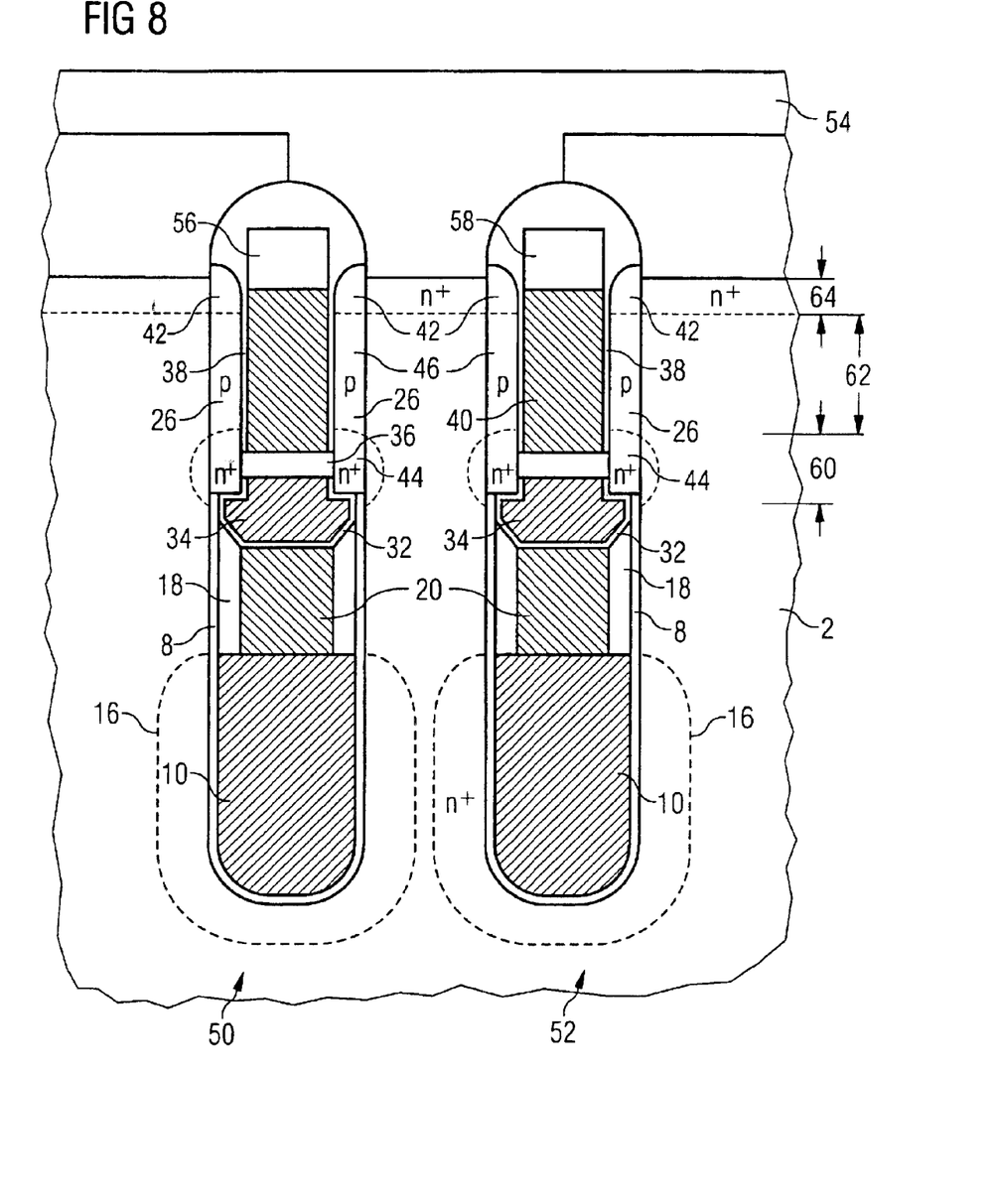
FIG. 8 is a sectional view of a semiconductor memory cell according to the invention.

FIG. 8 shows a first embodiment of the semiconductor memory cell according to the invention, which can be fabricated for example by the method described above. The illustration shows two directly adjacent semiconductor memory cells 50 and 52 having a common bit line 54 for making contact with the second doping regions 42. Word lines 56 and 58 serve for addressing the transistors of the semiconductor memory cells. The vertical transistors are formed completely in the epitaxial semiconductor layers 26, the first doping regions 44 lying in a lower partial section 60, a channel 46 lying in a central partial section 62, and the second doping regions 42 of the transistors lying in an upper partial section 64.

Figure 9:
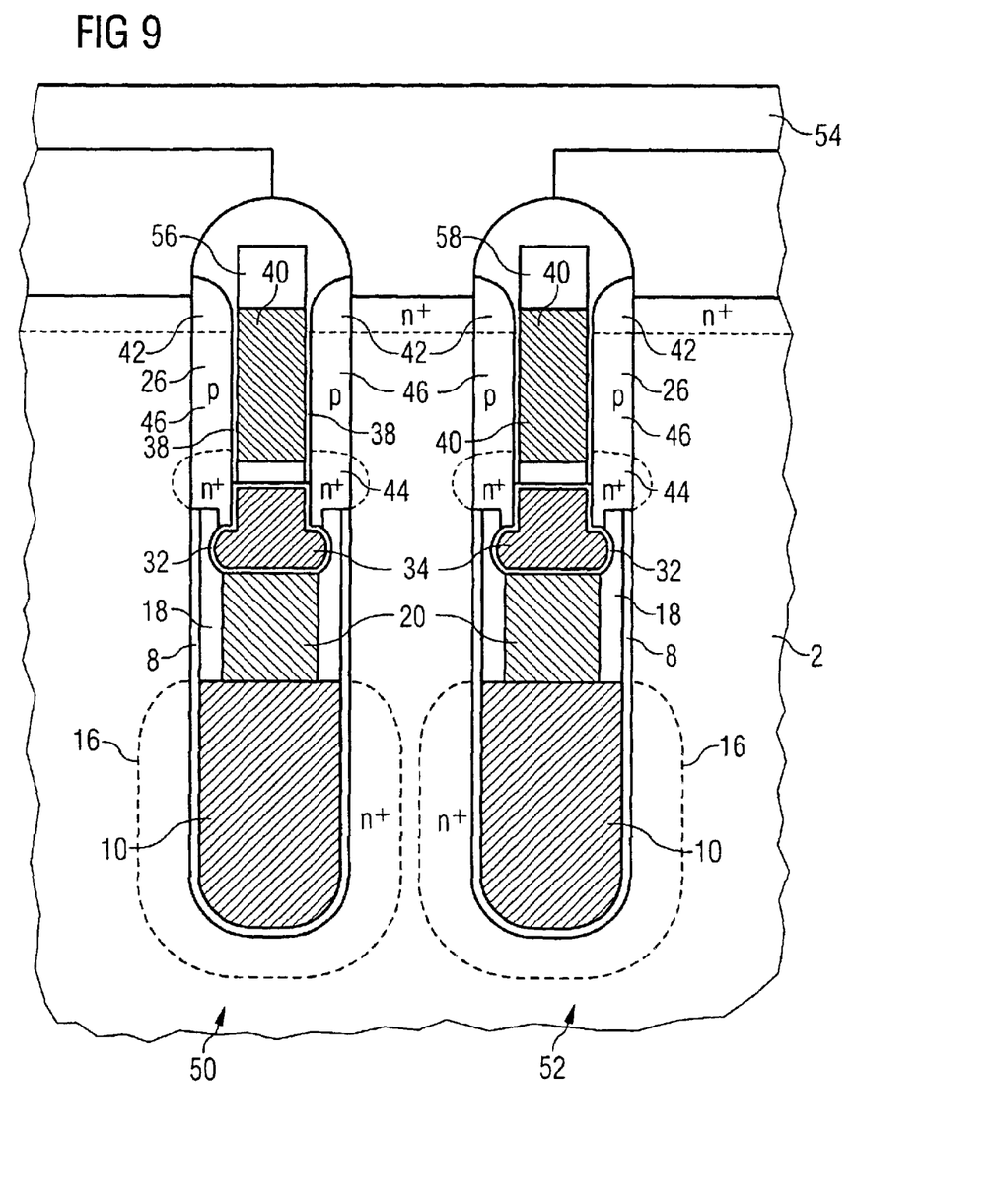
FIG. 9 is a sectional view of a further embodiment of the semiconductor memory cell according to the invention.

A further embodiment of the semiconductor memory cell according to the invention is shown in FIG. 9, and this can likewise be fabricated by the method according to the invention. The difference from the semiconductor memory cell shown in FIG. 8 merely consists in the fact that here the insulation collar 18 is not removed in the region of the lower edge of the epitaxial semiconductor layer 26, but rather is merely slightly incipiently etched. On account of the residual insulation collar 18, the outdiffusion into the semiconductor substrate 2 is limited, however, to an even greater extent than in the embodiment shown in FIG. 8.

Moreover, here the epitaxial semiconductor layer 26 is made somewhat thicker, so that it projects beyond the upper edge of the insulation collar 18, for example by 30 nm, and partly encloses the upper edge. In order to ensure a reliable electrical connection between the inner electrode 10 and the first doping region 44, the further conductive material 34 has not been etched back to the same extent. The remaining reference symbols designate the same structural features as in FIG. 8.

We claim:

1. A method for fabricating a vertical transistor, which comprises the steps of:
   providing a monocrystalline semiconductor substrate having at least one trench formed therein with a lower section and an upper section, at least the lower section of the trench being lined with a storage dielectric and filled with at least one conductive material;
   forming an auxiliary insulation layer on the conductive material;
   depositing an epitaxial semiconductor layer on uncovered sidewalls of the upper section of the trench;
   removing the auxiliary insulation layer;
   conformally depositing a nitride layer, the nitride layer being so thin that it only partially impairs a current flow;

filling the trench with a doped further conductive material for producing an electrical connection between the conductive material situated in the lower section and a lower partial section of the epitaxial semiconductor layer, the lower partial section of the epitaxial semiconductor layer being doped by indiffusion of dopants from the further conductive material to form a first doping region;

forming a gate dielectric on uncovered regions of the epitaxial semiconductor layer;

forming a gate electrode on the gate dielectric; and forming a second doping region in an upper partial section of the epitaxial semiconductor layer.

2. The method according to claim 1, which further comprises:

forming an insulation collar in the trench and the insulation collar, proceeding from a transition region between the lower and upper sections, extends in a direction of the upper section; and after the forming of the auxiliary insulation layer and before the depositing of the epitaxial semiconductor layer step, etching back the insulation collar as far as a plane lying above the auxiliary insulation layer, thereby uncovering the sidewalls of the trench above the insulation collar for the deposition of the epitaxial semiconductor layer.

3. The method according to claim 2, which further comprises before the insulation collar is etched back, applying an further auxiliary layer to the auxiliary insulation layer.

4. The method according to claim 2, which further comprises forming the storage dielectric with an upper edge, and the upper edge, as a result of the etching-back, terminates approximately with an upper edge of the insulation collar.

5. The method according to claim 1, which further comprises forming the nitride layer to be thinner than 1 nm.

6. The method according to claim 5, which further comprises forming the nitride layer to have a thickness of about 4–8 Å.

7. The method according to claim 1, which further comprises forming the nitride layer to isolate the further conductive material from the epitaxial semiconductor layer.

8. The method according to claim 2, which further comprises before the gate electrode is formed, applying a further insulation layer to the further conductive material.

9. The method according to claim 2, which further comprises:

forming the conductive material to contain a material forming an inner electrode of a trench capacitor and a conductive connecting material, which covers the inner electrode and is surrounded by the insulation collar.

10. The method according to claim 1, which further comprises forming the further conductive material from doped polysilicon.

11. A semiconductor memory cell, comprising:

a monocrystalline semiconductor substrate having a trench formed therein with an upper section, a lower section, and sidewalls;

a trench capacitor disposed in said lower section, said trench capacitor having an inner electrode formed from a conductive material;

an epitaxial semiconductor layer disposed on said sidewalls of said upper section of said trench and having a lower partial section, an upper partial section, and a lower edge;

a vertical transistor disposed in said upper section of said trench and formed completely in said epitaxial semiconductor layer, said vertical transistor having a first doping region formed in said lower partial section of said epitaxial semiconductor layer and a second doping region formed in said upper partial section;

a storage dielectric lining said sidewalls of said lower section and having an upper edge, said lower edge of said epitaxial semiconductor layer extending at least as far as said upper edge of said storage dielectric;

an insulation collar disposed in a transition region between said lower section and said upper section, said insulation collar covering said storage dielectric;

a further conductive material electrically connecting said inner electrode of said trench capacitor to said first doping region of said vertical transistor; and a nitride layer disposed at least between said further conductive material and said epitaxial semiconductor layer, said nitride layer having a thickness dimensioned to only partially impair a current flow.

12. The semiconductor memory cell according to claim 11, further comprising a conductive connecting material covering said inner electrode, surrounded by said insulation collar, and covered by said further conductive material.

13. The semiconductor memory cell according to claim 12, wherein said nitride layer is further disposed between said conductive connecting material and said further conductive material.

14. The semiconductor memory cell according to claim 11, wherein said nitride layer is thinner than 1 nm.

15. The semiconductor memory cell according to claim 14, wherein said nitride layer has a thickness of about 4–8Å.

16. The semiconductor memory cell according to claim 12, wherein said conductive material of said inner electrode, said conductive connecting material and said further conductive material are all doped polysilicon.

17. The semiconductor memory cell according to claim 11, wherein said vertical transistor has a gate electrode; and further comprising an insulation layer disposed between said further conductive material and said gate electrode.

18. The semiconductor memory cell according to claim 11, wherein said epitaxial semiconductor layer extends beyond an upper edge of said insulation collar in a direction of said lower section of said trench.

19. The semiconductor memory cell according to claim 18, wherein said epitaxial semiconductor layer extends beyond said upper edge of said insulation collar by about 30 nm.

20. The semiconductor memory cell according to claim 11, wherein said epitaxial semiconductor layer extends beyond an upper edge of said storage dielectric in a direction of said lower section of said trench.

21. The semiconductor memory cell according to claim 20, wherein said epitaxial semiconductor layer extends beyond said upper edge of said storage dielectric by about 30 nm.

* * * * *